United States Patent [19]

Sakuma

[11] 4,321,556
[45] Mar. 23, 1982

[54] SEMICONDUCTOR LASER

[75] Inventor: Isamu Sakuma, Tokyo, Japan

[73] Assignee: Nippon Electric Co., Ltd., Tokyo, Japan

[21] Appl. No.: 113,161

[22] Filed: Jan. 18, 1980

[30] Foreign Application Priority Data

| Jan. 18, 1979 [JP] | Japan | 54-4961 |
| Mar. 15, 1979 [JP] | Japan | 54-30257 |
| Mar. 22, 1979 [JP] | Japan | 54-33739 |

[51] Int. Cl.$^3$ .............................................. H01S 3/19
[52] U.S. Cl. .......................................... 372/45; 357/17; 372/48
[58] Field of Search ................... 331/94.5 H; 357/17, 357/18

[56] References Cited

U.S. PATENT DOCUMENTS 3,978,428  8/1976  Burnham et al. .............. 331/94.5 H

FOREIGN PATENT DOCUMENTS 2656532  7/1977  Fed. Rep. of Germany ..... 331/94.5 H

OTHER PUBLICATIONS

Burnham et al., "Nonplanar Large Optical Cavity Ga-,As/GaAlAs Semiconductor Laser", APL, vol. 35, No. 10, Nov. 15, 1979, pp. 734-736.

Primary Examiner—James W. Davie
Attorney, Agent, or Firm—Sughrue, Mion, Zinn, Macpeak and Seas

[57] ABSTRACT

A semiconductor laser is provided with a semiconductor substrate having a longitudinal groove formed therein. A first cladding layer is formed on the substrate by an epitaxial process which partially fills in the groove. A waveguide layer is provided atop the first cladding layer, the waveguide layer having either a plano-convex or concave-convex configuration and being thicker at its central region than at its outward edges. An active layer and a second cladding layer are laid over the waveguide layer, whereby the first and second cladding layers serve to confine the laser light within the waveguide layer.

13 Claims, 15 Drawing Figures

SEMICONDUCTOR LASER

BACKGROUND OF THE INVENTION

The present invention relates to a semiconductor laser and more particularly to a heterojunction semiconductor laser having a structure that is effective for controlling an oscillation mode.

In order to bring a semiconductor laser into continuous oscillation at a high temperature, it is necessary to employ such structure that the best thermal path for removing heat from the junction in the semiconductor laser can be provided and that an optical energy and an injection current can be confined in a particular region where an optical loss and wasteful carrier recombinations are simultaneously minimized.

To meet this condition, the so-called contact stripe-geometry semiconductor laser has been proposed, in which the electrode of the semiconductor laser is formed in a stripe shape, so that the width of the current flowing into the active layer is limited and the optical energy is confined in the active layer.

However, despite of the advantage of this semiconductor laser that oscillation by a direct current at a room temperature has become possible, it has a great disadvantage in performance in that an electromagnetic wave mode standing in the transversal direction parallel to the active layer, i.e., a transverse mode, is unstable and the transverse mode varies in response to variation of the injection current. This is due to the fact that the contact stripe-geometry laser does not have the function of confining a carrier and light in the active layer with respect to the transverse direction thereof. More particularly, in the current region slightly above the starting current value for the laser oscillation, the gain necessary for oscillation exceeds the loss only in the active layer region right under the stripe, and hence, the laser oscillates in a low or zeroth order of transverse mode. However, as the injection current is increased, the carriers injected into the active layer spread toward outside regions, so that the high gain region expands, resulting in a spreading of a transverse mode and generation of higher order modes. The instability and injection current dependency of the transverse mode becomes a cause of mode dispersion and the like in an optical transmission path in the case of carrying out an optical fiber communication by means of laser light, and thus extremely lowers the information capacity of the transmission path. Accordingly, a semiconductor laser used as an optical source in an optical fiber communication system is required to oscillate in a single mode over a large injection current region. Therefore, trials have been made so as to obviate such disadvantage by structurally incorporating waveguide means within the laser element. For instance, the strip buried heterostructure (SBH) laser proposed by W. T. Tsang et al on pages 311 to 314 of Applied Physics Letters Vol. 32, No. 5, Mar. 1, 1978 is understood to be one of such trials. In this structure, as will be later described more in detail, a waveguide layer is provided in addition to the active layer, and only the active layer is surrounded by a substance having a low refractive index, so that the confining of injected carriers and the confining of photons are respectively effected in separate regions and a light propagation effect is provided by the waveguide layer. Thus, it is intended to prevent higher-order oscillations and to maintain a single mode oscillation over a large current region.

However, the manufacture of the SBH lasers has an obvious shortcoming in that it necessitates different individual processes of epitaxial growth. Accordingly, such SBH lasers involve the problem that the process of manufacture is so complex that reproducibility in the manufacture of the laser elements is poor and they are not suitable for realizing economy and mass-producibility.

On the other hand, as disclosed in U.S. Pat. No. 3,978,428 issued to R. D. Burnham et al, the etched buried heterostructure (EBH) laser has been known, in which an output beam configuration and stability of a transverse mode is improved by providing a groove in a substrate to curve an active layer. However, in this structure, since the active layer is directly sandwiched by cladding layers having a low refractive index, the difference in the refractive index becomes large at these interfaces. Consequently, if the width of the curved section of the active layer is selected to be large, then higher-order transverse modes are liable to oscillate. From the view point of ease of the crystal growth, the manufacture is easier when the width of the groove in the substrate is broad to a certain extent than when it is narrow. However, at the groove width necessitated for oscillation in a fundamental transverse mode, such laser structure has a disadvantage in that controllability and reproducibility are poor.

OBJECTS OF THE INVENTION

It is one object of the present invention to provide a high power output semiconductor laser which is easy to manufacture and which has its fundamental transverse mode controlled.

Another object of the present invention is to provide a high power output semiconductor laser which has a good injection efficiency and which has its fundamental transverse mode controlled.

Still another object of the present invention is to provide a semiconductor laser which can operate at a high power output in a controlled fundamental mode, and which is of narrow beam divergence, easy to manufacture, and suitable for mass-production at a high yield.

SUMMARY OF THE INVENTION

In the semiconductor laser according to the present invention, four semiconductor layers are continuously grown on the semiconductor substrate by the conventional epitaxial growth method. A first semiconductor layer is a first cladding layer having an optical confining effect, and a second semiconductor layer is a waveguide layer having both an optical propagating effect and a carrier confining effect. A third semiconductor layer is an active layer for generating light, and a fourth semiconductor layer is a second cladding layer having both an optical confining effect and a carrier confining effect. The active layer is doped in a manner such that it forms a rectifying junction with the second cladding layer or the waveguide layer. The waveguide layer involves a stripe-shaped region which is made locally thicker than the surrounding region so that an optical power output may be obtained from this stripe region.

DETAILED DESCRIPTION OF THE PRIOR ART

Figure 1:
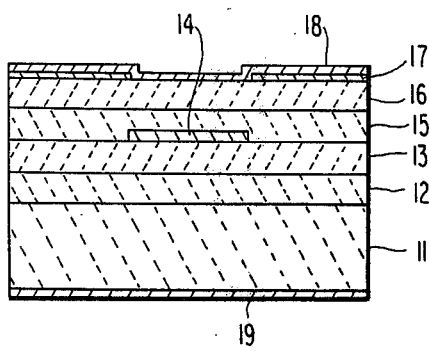
FIG. 1 is a transverse cross-sectional view of a known semiconductor laser having a structure provided with a waveguide layer.

Now in connection with the process for manufacture and structure of the above-referred SBH laser proposed by W. T. Tsang et al, description will be directed to what problems should be resolved by the present invention, with reference to FIG. 1. A typical manufacturing process of the SBH laser consists of four principal steps. The first step is effecting liquid-phase epitaxial growth on an n-type GaAs semiconductor substrate 11, of an n-type $Al_{0.3}Ga_{0.7}As$ layer 12 serving as a first cladding layer, an n-type $Al_{0.1}Ga_{0.9}As$ layer 13 serving as a waveguide layer, a p-type GaAs layer 14 serving as an active layer, and a p-type $Al_{0.3}Ga_{0.7}As$ layer serving as a second cladding layer. The second step is a mesa etching step of removing a part of the second cladding layer 15 and a part of the active layer 14 to form a mesa. The third step is again forming the second cladding layer 15 around the mesa and forming thereon a p-type GaAs layer 16 serving as a contact-facilitating layer, whereby the stripe-shaped active region is completely surrounded by a substance having a lower refractive index than that of the stripe-shaped active region. More particularly, when the active region substance is GaAs, it is a step of effecting second liquid-phase epitaxial growth so that the stripe region may be buried in AlGaAs applied on the outsides of the stripe region or the stripe region may be surrounded by AlGaAs. The fourth step is the forming of an apertured silicon dioxide ($SiO_2$) film 17 on the contact facilitating layer 16 to regulate a current so as to be injected through the aperture into the stripe-shaped active region 14, forming a positive electrode layer 18 on the $SiO_2$ film 17 and on the portion of the contact-facilitating layer 16 exposed through the aperture, and forming a negative electrode layer 19 on the bottom surface of the substrate 11.

When a forward bias is applied to the SBH laser manufactured through the above-mentioned manufacturing process, laser oscillation occurs in the active layer 14. Then, the laser light produced in the active layer 14 largely penetrates into the n-$Al_{0.1}Ga_{0.9}As$ waveguide layer 13. Consequently, the distribution of the effective refractive index of the waveguide layer 13 along its lateral direction within a transverse cross-sectional view becomes such that the effective refractive index at the position right under the active region 14 is higher than that at the positions where the active region does not exist, that is, at the positions outside the active region. This results in a strip-loaded waveguide structure having an appropriate width. The term "effective refractive index" used in this description means the apparent refractive index which can be varied due to the boundary condition of the laminated layers when the laser light propagates along the junction plane thereof.

Moreover, since the confining of carriers is also effected in the vertical and lateral directions, the transverse mode is not dependent upon the gain distribution, and thus a stable fundamental transverse mode oscillation can be obtained over a large injection current region. Thus the disadvantages of the contacted stripe-geometry laser have been greatly improved. In this respect, the SBH laser was an epoch-making proposal.

However, this SBH laser has an obvious disadvantage that it necessitates the above-described two separate epitaxial growth processes. Another disadvantage is in that a number of layers having different compositions and thicknesses must be etched or removed, and due to the difference in the composition and thickness, control for the etching or removal is difficult. Still an other disadvantage is in that when the layer mixed with aluminum is exposed to the atmosphere, an oxide film is formed on the surface of the layer and this oxide film obstructs the second liquid-phase epitaxial growth. In addition, there is a possibility that the second liquid-phase epitaxial growth may resolve the region formed by the first epitaxial growth and thereby defects may be produced in the active region. Therefore, the structure shown in FIG. 1 has disadvantages in that the method for manufacturing the structure lacks controllability, reproducibility and reliability, and thus the structure is not adapted to realize economy and mass-producibility.

Next, the EBH laser disclosed in the above-referred U.S. Pat. No. 3,978,428 will be explained briefly with reference to FIG. 2. In this prior art semiconductor laser, four semiconductor layers are epitaxially grown in liquid-phase on a grooved semiconductor substrate 21. They consist of a third cladding layer 22 having both an optical confining effect and a carrier confining effect, an active layer 24, a second cladding layer 25 having both an optical confining effect and a carrier confining effect, and a contact-facilitating layer 26. Prior to formation of the third cladding layer 22, a stripe-shaped groove 211 is provided in the substrate 21, and further, a diffused layer 212 is formed therein. The central portion of the third cladding layer 22 and the central portion 241 of the active layer 24 are positioned within the groove 211 which has been formed in the substrate 21 and extends through the diffusion layer 212. The third cladding layer 22 and the active layer 24 are of different conductivity types to provide a rectifying junction 201 therebetween. A positive electrode layer 28 and a negative electrode layer 29 are provided so as to contact with the contact-facilitating layer 26 and the substrate 21, respectively. The substrate 21 and third cladding layer 22 are of different conductivity type from the diffused layer 212 such that rectifying junctions 202 and 203 are formed at the interfaces between the substrate 21 and the diffused layer 212 and between the diffused layer 212 and the third cladding layer 22, respectively. When the rectifying junction 201 is forward biased, the rectifying junction 202 is forward biased and the rectifying junction 203 is backward biased.

Especially, if the substrate 21 is formed of n-type GaAs, then the diffused layer 212 can be formed of p-type GaAs, the third cladding layer 22 of n-type GaAlAs, the active layer 24 of p-type GaAs, the second cladding layer 25 of p-type GaAlAs, and the contact-facilitating layer 26 can be formed of p-type GaAs.

The central portion 241 of the active layer 24 has a bowl-shaped cross-section that is thick at its center region and is very shallow at the region adjacent to the upper edge of the groove 211. When the rectifying junction 201 is forward biased, light produced as a result of recombination of carriers is propagated to the active layer 24 having a high refractive index which is sandwiched between the third cladding layer 22 and the second cladding layer 25. Consequently, the oscillation region of the semiconductor laser is restricted to the central portion 241 of the active layer 24. Assuming that the thickness of the central portion 241 is 1 $\mu$m and the width of the bowl-shape is 1-2 $\mu$m, then the output optical power emitted from the semiconductor laser takes a fundamental transverse mode of generally symetrical pattern. Also, even if the injection current is increased, stability of the transverse mode can be retained.

However, this structure has a disadvantage that since the central portion 241 of the active layer 24 is thick, the oscillation threshold current becomes high. While reduction of the oscillation threshold current can be achieved by making the central portion 241 of the active layer 24 thin, as a result the output light beam divergence in the vertical direction becomes large, and hence the shape of the output beam is deformed. Moreover, since the oscillation region of the active layer 24 is completely surrounded by the cladding layers 22 and 25 having a low refractive index, a large change in effective refractive index arises at their interfaces. Consequently, if the width of the bowl-shape of the oscillation region is broadened, in addition to the fundamental transverse mode, higher-order transverse modes become liable to oscillate. From the view point of easiness in crystal growth, manufacture is easier when the width of the groove 211 is broad to a certain extent than when it is narrow. In other words, with the dimension of the groove 211 formed in the semiconductor substrate that is necessitated for obtaining a semiconductor laser which oscillates in the fundamental transverse mode, the semiconductor laser has a disadvantage in that controllability and reproducibility are poor.

DETAILED DESCRIPTION OF PREFERRED EMBODIMENTS

Figure 3:
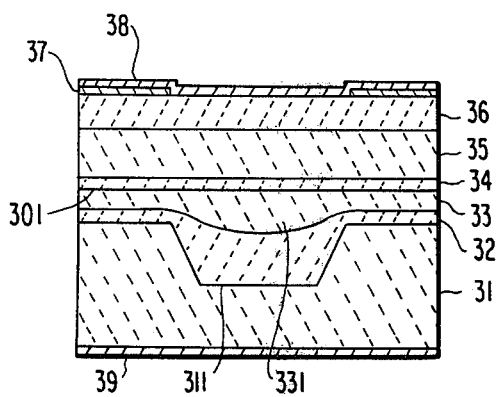
FIG. 3 is a transverse cross-sectional view of a semiconductor layer showing a first preferred embodiment of the present invention.

Now description will be made to semiconductor lasers according to the present invention. FIG. 3 shows one example of the semiconductor laser structure according to the present invention which is easiest in manufacture. Five semiconductor layers are successively grown on a semiconductor substrate 31 having a stripe-shaped groove 311 formed therein. That is, a first cladding layer 32 having an optical confining effect, a waveguide layer 33 having an optical propagating effect and a carrier confining effect, an active layer 34, a second cladding layer 35 having both an optical confining effect and a carrier confining effect, and a contact-facilitating layer 36 are successively grown. The upper surface of the waveguide layer 33 is flat, but its lower surface projects in the region extending along the groove 331. The active layer 34 and the waveguide layer 33 are of different conductivity types to provide a rectifying junction 301 therebetween. An apertured SiO$_2$ film 37 is provided on the contact-facilitating layer 36, and the layer 36 makes contact with an electrode layer 38 provided on the SiO$_2$ film 37 through the aperture. Another electrode layer 39 is provided on the bottom surface of the substrate 31. When the rectifying junction 301 is forward biased, the width of the current injected to the active layer 34 is nearly regulated by the width of the aperture in the SiO$_2$ film 37, and the injection current flows through the central portion of the active layer 34. The active layer 34 in which carriers are injected and where light is emitted by recombination of the carriers, is sandwiched between the second cladding layer 35 and the waveguide layer 33 on its upper and lower sides, which layers have a larger energy gap and a smaller refractive index than the active layer 34 to effect confining of carriers, and on the other hand, while allowing the emitted light to spread into the waveguide layer 33 having a slightly smaller refractive index, perfect confining of the light is effected by the first cladding layer 32 and the second cladding layer 35. In other words, the illustrated semiconductor laser has a double heterostructure in which a layer having an optical confining effect and a layer having a carrier confining effect are separated.

Now more detailed description will be made with respect to the case where GaAs and GaAlAs are used to form the above-described various layers. The substrate 31 is formed of n-type GaAs, the first cladding layer 32 of n-type GaAlAs, the waveguide layer 33 also of n-type GaAlAs, the active layer 34 of p-type GaAs, the second cladding layer 35 of p-type AlGaAs, and the contact-facilitating layer 36 is formed of p-type GaAs. Here, the Al proportion in the composition of the waveguide layer 33 is determined so that the layer 33 may have an appropriate refractive index and an energy gap of such degree that the carriers injected into the active layer 34 may be perfectly confined but the light emitted in the active layer 34 may spread out sufficiently.

The central portion 331 of the waveguide layer 33 corresponding to the groove 311 is contiguous to the first cladding layer 32 which is deformed into an arcuate shape toward the substrate 31, and has a convex lower surface and a flat upper surface, that is, the central portion 331 has a cross-section of plano-convex shape. The active layer 34 is provided flat on the waveguide layer 33 with a uniform layer thickness, and the layer thickness is made thin to such extent that the laser light may sufficiently spread out into the waveguide layer 33.

When the above-described structure is employed, the rectifying junction 301 is forward biased, carriers are injected into the active layer 34 and recombine there, and thereby light is emitted. The light spreads out into the waveguide layer 33. Since the waveguide layer 33 is sufficiently transparent for the light emitted in the active layer 34, there is no light loss in the waveguide layer 33. Therefore, the light propagates, spreading through the waveguide layer 33 and the active layer 34. Moreover, since the waveguide layer 33 and active layer 34 are sandwiched between the first cladding layer 32 and the second cladding layer 35 which both have a low refractive index, eventually the light is concentrated to the central region 331 of the waveguide layer 33. Owing to the provision of the layer 32 for preventing the light from escaping under the layer 33, a laser output beam having a good symmetry can be obtained without enhancing the oscillation threshold current.

One practical example of the process for manufacturing the above-described semiconductor laser according to the present invention will be described in greater detail with reference to FIGS. 4A to 4D.

Figure 4A:
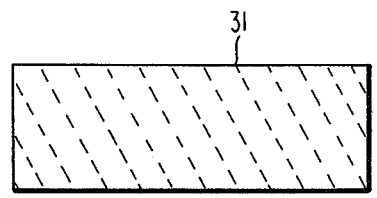
FIGS. 4A to 4D are transverse cross-sectional views for explaining principal steps for manufacturing the semiconductor laser in FIG. 3.
Figure 4B:
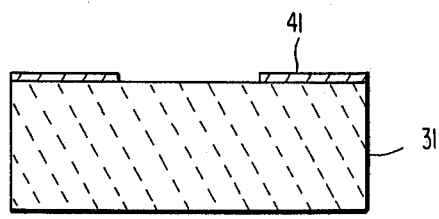
Figure 4D:
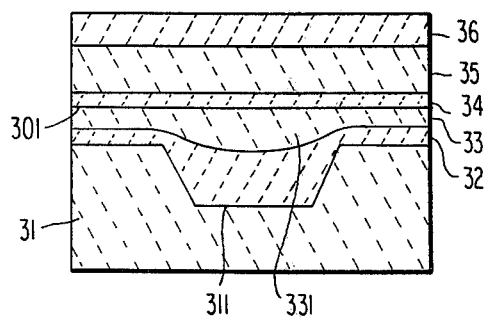
Figure 4C:
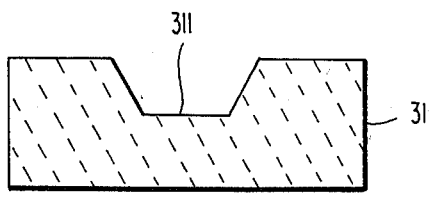

An n-type GaAs semiconductor substrate 31 shown in FIG. 4A has a surface consisting of a {100} plane, and a photo-resist film 41 is formed on the substrate surface as shown in FIG. 4B. Subsequently, a stripe-shaped groove 311 in a (110) orientation is formed on the substrate 31 through chemical etching (FIG. 4C). The groove 311 has the dimensions of about 1.0 $\mu$m in depth and 2.0 $\mu$m in width, and it is formed through the conventional chemical etching by employing the photo-resist film 41 as a selective etching mask. More particularly, the etching is effected for about 90 seconds under a stirring condition with an etching solution containing one part of phosphoric acid, one part of hydrogen peroxide and five parts of methanol. In succession to the formation of the groove 311, the remaining photo-resist film 41 is removed from the surface of the substrate 31, and thereafter the respective layers are grown consecutively by means of liquid-phase epitaxial growth.

An n-type $Al_{0.38}Ga_{0.62}As$ layer (first cladding layer) 32 is stopped to grow at the state where the layer has a cross-section configuration sinking in an arcuate form at the section of the groove 311, and then an n-type $Al_{0.1}Ga_{0.9}As$ layer (waveguide layer) 33 is made to grow on the layer 32. This liquid-phase epitaxial growth is continued until the central portion is completely filled and the entire upper surface becomes substantially flat. Subsequently, a p-type GaAs layer 34 serving as an active layer, a p-type $Al_{0.38}Ga_{0.62}As$ layer (second cladding layer) 35 and a p-type GaAs layer (contact-facilitating layer) 36 are made to grow, and then the liquid-phase epitaxial growth is terminated (FIG. 4D). When the growing temperature and the cooling speed are held constant, the configuration of the upper surface of the first cladding layer 32 can be made to have a desired shape by appropriately controlling the growing time, and for instance, if the growing time is chosen short, then the surface of the n-type $Al_{0.38}Ga_{0.62}As$ layer 32 serving as a first cladding layer becomes inwardly arcuated towards the substrate 31.

Typical thicknesses of the respective layers are, at the central portion of the groove 311, 0.8 $\mu$m for the n-type $Al_{0.38}Ga_{0.62}As$ layer 32, 0.3 $\mu$m for the n-type $Al_{0.1}Ga_{0.9}As$ layer 33, 0.1 $\mu$m for the p-type GaAs active layer 34, 1.2 $\mu$m for the p-type $Al_{0.38}Ga_{0.62}As$ layer 35 and 1.2 $\mu$m for the p-type GaAs layer 36. At the outside portions, the layer 32 is typically 0.1 $\mu$m thick and the waveguide layer 33 is typically 0.15 $\mu$m thick. Dopant concentrations of the respective layers 32, 33, 34, 35 and 36 are typically $n-3\times10^{17}/cm^3$, $n-3\times10^{17}/cm^3$, $p-5\times10^{17}/cm^3$, $p-3\times10^{17}/cm^3$ and $p-10^{18}/cm^3$. Then the electrode 38 is formed by depositing the $SiO_2$ film 37 having a stripe-shaped window onto the surface of the p-type GaAs layer 36 and further vacuum-evaporating a metal thereon. The stripe-shaped window is provided so as to be positioned right above the stripe-shaped groove 311 provided on the n-type GaAs substrate 31. The electrode 39 is formed on the lower surface of the n-type GaAs substrate 31.

The contact-facilitating layer 36 can be omitted if an ohmic contact region is formed into the second cladding layer 36 by diffusing a p-type impurity such as zinc (Zn). The diffusion of the zinc can be carried out through the aperture of the $SiO_2$ in the depth of about 0.5 $\mu$m.

In operation, by applying a positive potential to the electrde 38 and a negative potential to the electrode 39, the junction 301 is forward biased and thereby carriers are injected into the p-type GaAs active layer 34. The p-type GaAs active layer 34 is sandwiched on its upper and lower sides by the p-type $Al_{0.38}Ga_{0.62}As$ layer 35 and the n-type $Al_{0.1}Ga_{0.9}As$ layer 32 both having large energy gaps. More particularly, in contrast to the energy gap of the GaAs layer 34 of 1.4 eV, the energy gap of the $Al_{0.1}Ga_{0.9}As$ layer 33 is 1.55 eV and the energy gap of the $Al_{0.38}Ga_{0.62}As$ layer 35 is 1.95 eV. Owing to these heterojunctions, the carriers injected into the active layer 34 can be confined within the active layer 34 without being diffused. In this way, light is emitted by recombination of carriers within the active layer 34, and when the gain overcomes the loss owing to a sufficient injection current, a laser light is emitted from the active layer 34. This light spreads out into the n-type $Al_{0.1}Ga_{0.9}As$ layer (waveguide layer) 33. Since the waveguide layer 33 has larger energy gap than that of the active layer 34, the laser light cannot be attenuated within the waveguide layer 33. Therefore, the laser light propagates thoughout the active layer 34 and the waveguide layer 33.

Upon this light propagation, the refractive index $n_3$ of the p-type GaAs active layer 34 is $n_3$ approximately equal to 3.590, while the refractive index $n_2$ of the n-type $Al_{0.1}Ga_{0.9}As$ layer 33 is $n_2$ approximately equal to 3.52. Owing to the small difference in the refractive index between these respective layers, the optical confining effect at the interface between the p-type GaAs layer 34 and the n-type $Al_{0.1}Ga_{0.9}As$ layer 33 is very weak. However, the refractive index n of the $Al_{0.38}Ga_{0.62}As$ cladding layers 32 and 35 is n approximately equal to 3.34, that is, low as compared to the refractive indexes of the layers 33 and 34, and hence they produce a strong optical confining effect. More particularly, the light beam is guided by the layer 32 and 35 having the lower refractive indexes, and thus the light is confined within the layers 33 and 34.

With regard to the light propagating in the transversal direction parallel to the junction 301, the effective refractive index in the transversal direction of the waveguide layer 33 decreases as the thickness of the layer reduces, because the waveguide layer 33 is adjacent to the lower index first cladding layer 32 and is formed so as to have the maximum thickness at the central portion 331 in the grooved region 311 and to reduce its thickness towards the outside portions of the groove 311. Therefore, the above-described waveguide structure is similar to the rib-guide optical-waveguide structure proposed by T. P. Lee et al on pages 432 to 435 of IEEE Journal of Quantum Electronics, Vol. QE-11, No. 7, July 1975.

Figure 4E:
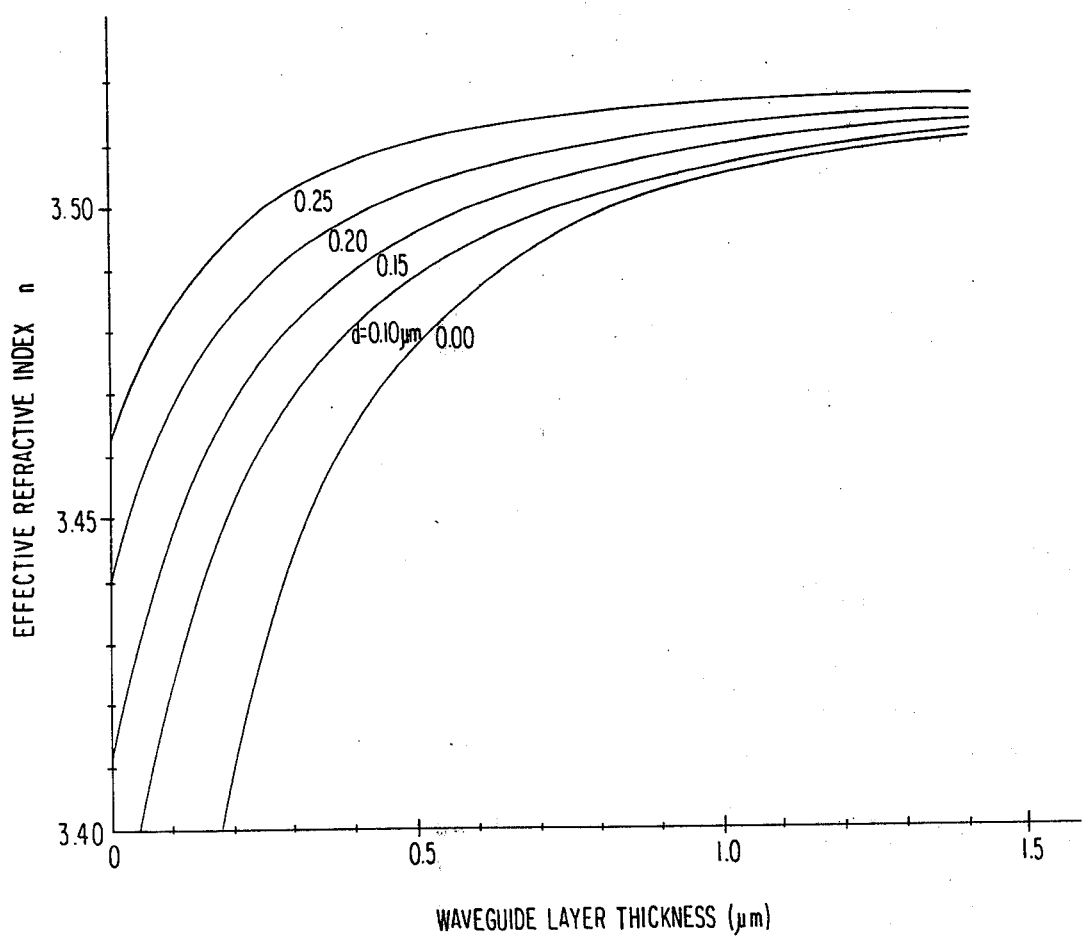
FIG. 4E is a graph of the effective refractive index versus the thickness of the waveguide layer in FIG. 3.

In the above embodiment, the calculated values of the effective refractive index of four laminated layers 32, 33, 34 and 35 at the control portion is typically 3.469 while that at the outside portion is 3.440. The effective refractive index can be changed by the boundary conditions such as thickness and composition of each laminated layer. When the thickness of the waveguide layer 33 is increased, the effective refractive index n along the junction plane increases as shown in FIG. 4E, wherein the thickness of the active layer 34 is changed as a parameter.

If the manufacturing process according to the preferred embodiment as described above with reference to FIG. 4 is employed, a semiconductor laser having a stripe-shaped optical waveguide can be obtained through a single liquid-phase epitaxial growth step, and furthermore, as a result of simplification of the manufacturing process, naturally the chance of inducing defects is reduced. Consequently, an elongated life and enhanced reliability and high quality can be attained.

Another advantage of the above-described structure is unnecessity of a mesa etching step for the grown layers that is difficult to control and has been necessitated in the prior art. Owing to this advantage, there is provided a manufacturing process suitable for realizing reproducibility, mass-producibility and a high yield.

Still another merit of the above-described structure is that an optical waveguide having a special optical condensing effect such that a light confined in the stripe-shaped optical waveguide characteristic of the semiconductor laser according to the above-described embodiment is condensed at the central portion of the waveguide, can be formed in a simple manner. This optical condensing effect is due to the fact that the structure is such that the effective refractive index is highest at the plano-convex central portion 331 of the n-type $Al_{0.38}Ga_{0.62}As$ layer (the optical waveguide layer) 33.

According to the above-described preferred embodiment, if the stripe-shaped groove is formed in a [01$\bar{1}$] orientation on a {100} plane of the substrate 31, then {111} A planes appear on the insides of the groove to form a mesa type groove. When the crystal growth is effected by making use of such semiconductor substrate crystal which has been worked into the configuration whose defining planes have particular plane orientations, since the growth in the lateral direction of the inside walls of the mesa type groove consisting of {111} A planes is faster than the growth of the bottom surface of the groove consisting of a {100} plane, in the beginning of the growth the first cladding layer 32 within the groove 311 takes an arcuated shape with its central portion depressed inwardly towards the substrate 31. As the growth proceeds and the layer 32 becomes thicker, the level difference of the depression is gradually reduced while the width of the depression is successively narrowed. Eventually, when the growth has reached a certain thickness, the depression is completely filled and the surface becomes flat.

Such a phenomenon is a characteristic property that is often experienced in the liquid-phase epitaxial growth process, and the above-described embodiment of the present invention has resolved the problem in the prior art by positively and skillfully making use of this phenomenon. More particularly, the growth of the first cladding layer 32 is ceased at a time point when the arcuated shape caused by the groove 311 initially formed in the substrate 31 is still retained, and subsequently the growth of the waveguide layer 33 is effected until its upper surface becomes flat. Then, the formed waveguide layer 33 has a plano-convex cross-section configuration in which the layer thickness is slightly thick at the region 331 right above the groove 311 and becomes thin at the outside portions of the region 331. The above-described configurations are not largely varied in the layers grown on the substrate even if the initial shape of the groove is somewhat changed. Thus a semiconductor laser provided with a plano-convex waveguide can be obtained very simply with good controllability.

As described above, the semiconductor laser according to the illustrated embodiment of the present invention has a low oscillation threshold current and can oscillate in a fundamental transverse mode. Since the active layer is grown on a flat surface, even a layer of 0.1 μm or less in thickness can be grown simply with good reproducibility. Also, since the central portion 331 of the waveguide layer 33 is in an embedded state, and since the effective refractive index of the waveguide layer 33 is reduced as the thickness of the layer decreases, a substantial portion of the generated light is confined within the plano-convex region, that is, the central portion 331 of the waveguide layer 33. Moreover, in the plano-convex region 331, the thickness of the layer is thickest at the central part, and especially, the effective refractive index is also largest at this central part. Consequently, the light confined in the plano-convex region 331 is further subjected to a condensing effect so as to be condensed at its central part. Therefore, by adjusting the thickness of the active layer and the effective refractive index of the plano-convex region 331, it is possible to provide a continuous wave (CW) room-temperature oscillation laser which has longitudinal and transverse modes at the lowest states in the both directions and a very low oscillation threshold current. Furthermore, a relatively narrow output beam divergence and high catastrophic optical damage (COD) threshold could be expected, since a large portion of light propagates in the waveguide layer, rather than in the active layer.

Figure 2:
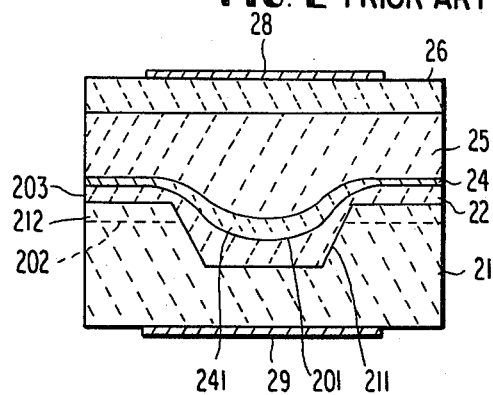
FIG. 2 is a transverse cross-sectional view of another known semiconductor laser having a structure in which a substrate is provided with a groove.

In the above-described embodiment of the present invention, due to the presence of the waveguide layer 33, in the case where the width of the bowl-shape is equal to that in the prior art structure shown in FIG. 2, the effective refractive index change in the transverse direction becomes small. Therefore, even if the width of the groove is broadened, oscillation would not occur in higher-order transverse modes. This results in that the reproducibility, mass-producibility and a yield can be enhanced without degrading the controllability for the layer thickness in the crystal growth.

In this connection, upon forming means for injecting carriers to the active layer, if provision is made such that a current may be injected efficiently into the portion of the active layer right above the stripe shaped groove, then the oscillation threshold current in the semiconductor laser according to the above-described embodiment can be further reduced and the external differential quantum efficiency also becomes high. Therefore, a stripe-shaped electrode formed via the $SiO_2$ film as in the above-described embodiment generally has a low injection current efficiency. Thus if importance is attached to the injection current efficiency, then it is desirable to employ a structure in which a layer for controlling the injection current to follow a path passing through the grooved region is provided in the semiconductor substrate, that is, to employ means for forming a back-biased junction within the semiconductor substrate. For that purpose, it is only necessary to preliminarily form a p-type layer in the surface portion of the n-type GaAs substrate by diffusion of zinc (Zn), prior to forming a stripe-shaped groove on the surface of the semiconductor substrate.

Now one modified embodiment of the semiconductor laser according to the present invention which is provided with the aforementioned back-biased junction, will be briefly described with reference to FIG. 5. On the upper surface of the semiconductor substrate, a stripe-shaped groove 511 is formed and a diffused layer 512 is provided on the opposite sides of the groove. Then, similar layers to those shown in FIG. 3 are successively grown on the diffused layer 512 in a similar manner. More particularly, a first cladding layer 52, a waveguide layer 53, an active layer 54, a second cladding layer 55 and a contact-facilitating layer 56 are grown. The central portion of the first cladding layer 52 is formed in a depressed bowl-shape due to the groove 511 formed in the substrate 51. The active layer 54 and the waveguide layer 53 are of different conductivity types and a rectifying junction 501 is formed therebetween. Electrodes 58 and 59 are provided so as to make contact with the substrate 51 and the contact-facilitating layer 56, respectively, and a forward-biased rectifying junction 501 is formed at the interface between the active layer 54 and the waveguide layer 53.

The substrate 51 and the first cladding layer 52 are of different conductivity type from the diffused layer 512, and rectifying junctions 502 and 503 are formed at the interfaces between the semiconductor substrate 51 and the diffused layer 512 and between the diffused layer 512 and the first cladding layer 52, respectively. When the rectifying junction 501 is forward biased, the rectifying junction 503 is backward biased, so that the current injected to the active layer 54 is restricted to its central portion opposed to the central portion 531 of the waveguide layer 53.

Figure 6A:
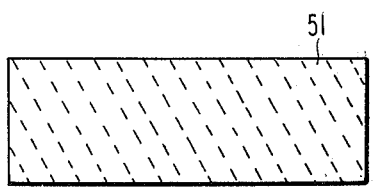
FIGS. 6A to 6D are transverse cross-sectional views for explaining principal steps for manufacturing the semiconductor laser in FIG. 5.
Figure 6B:
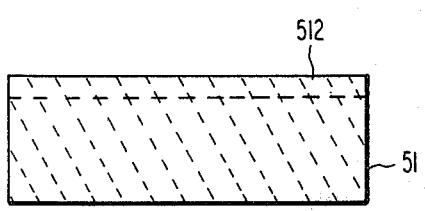
Figure 6C:
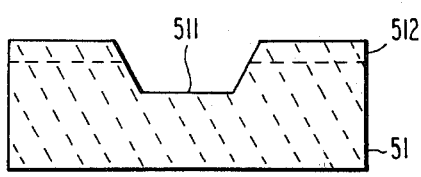
Figure 6D:
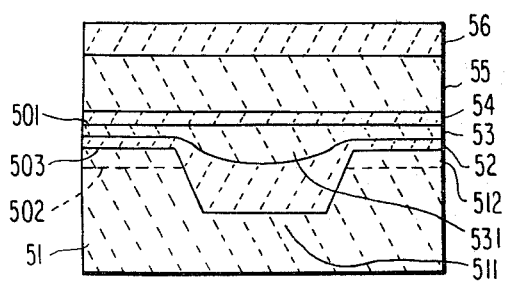

In the followings, one preferred embodiment of the process for forming the diffused layer 512 will be explained with reference to FIG. 6. At first, in a surface portion of a semiconductor substrate 51 made of n-type GaAs and having an impurity concentration of $1-3 \times 10^{18}/cm^3$ shown in FIG. 6A, a zinc (Zn) diffused layer 512 is formed in depth of about 0.7 $\mu m$ (FIG. 6B). The concentration of Zn could be selected a little larger than the impurity concentration of the substrate 51. In the next step, a groove 511 is formed on the substrate 51 substantially in a similar manner to the process shown in FIGS. 4B to 4D. More particularly, a photo-resist film is deposited on the substrate, after exposure to a light an elongated window of 2 $\mu m$ in width is formed, and then a stripe-shaped groove 511 is formed on the surface of the substrate 51 by employing the windowed photo-resist film as a mask for selective etching (FIG. 6C). The depth of the groove 511 exceeds the depth of the Zn diffusion layer 512, and in the illustrated embodiment, the groove 511 has a depth of about 1.0 $\mu m$. Upon forming the groove 511, the same etching solution so that used in the first preferred embodiment is employed, and when the etching has been effected for about 90 seconds at a room temperature under a stirring condition, a groove of preferable depth is obtained. Subsequently to the formation of the groove 511, the remaining photo-resist film is removed from the surface of the semiconductor substrate 51, thereafter the respective semiconductor layers are successively grown by liquid-phase epitaxial growth, and then a wafer shown in FIG. 6D is formed.

More particularly, the growth of the n-type $Al_{0.38}Ga_{0.62}As$ layer 52 is ceased at the state where the layer 52 has an arcuately sinking cross-section in the section above the groove 511, and the n-type $Al_{0.1}Ga_{0.9}As$ layer 53 is made to grow thereon. The growth of the layer 53 is continued until the depression in the central portion is completely filled and the entire upper surface becomes substantially flat. Subsequently, the p-type GaAs layer 54 serving as an active layer, the p-type $Al_{0.38}Ga_{0.62}As$ layer 55 and the p-type GaAs layer 56 are made to grow in succession, and then the liquid-phase epitaxial growth is terminated.

Typical thickness and dopant concentrations of the respective layers could be chosen substantially equal to those used in the first preferred embodiment illustrated in FIG. 3. Finally, the electrodes 58 and 59 are deposited on the p-type GaAs layer 56 and the substrate 51, respectively, through the conventional method, and then the semiconductor laser is completed.

The operation of the semiconductor laser according to the above-described embodiment is similar to that described in connection with the first preferred embodiment illustrated in FIG. 3, and so, description thereof will be omitted.

However, it is to be noted that the operation of the semiconductor laser according to the above-described modified embodiment differs from that of the first preferred embodiment illustrated in FIG. 3 in the following point.

When the rectifying junction 501 is forward biased, the injection current is restricted to a path passing through the groove 511 owing to the back-bias at the rectifying junction 503. Consequently, formation of the $SiO_2$ film as used in the first preferred embodiment illustrated in FIG. 3 becomes unnecessary, and yet this modified embodiment has a characteristic advantage that the injection current efficiency can be improved.

In the above-described two preferred embodiments, examples of the structure in which the upper surface of the waveguide layer, that is, the interface between the waveguide layer and the active layer is made flat and the active layer is formed in a flat shape, have been shown. However, the feature of the present invention can be realized without being restricted by the condition that the upper surface of the waveguide layer is made flat. In other words, it is only necessary that the thickness of the waveguide layer in the stripe section be thicker than the sections on the outside portions of the stripe section. In the following, further modified embodiments of the present invention which fulfil the above-mentioned requirement, will be described briefly.

Figure 5:
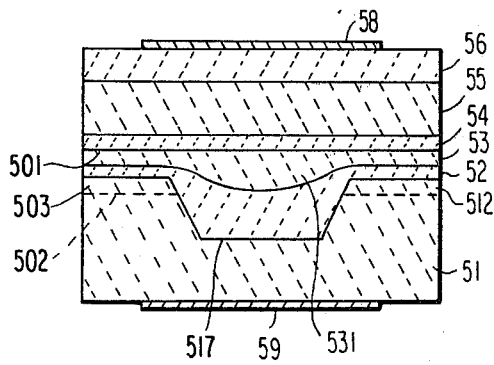
FIG. 5 is a transverse cross-sectional view of a semiconductor laser showing a second preferred embodiment of the present invention.
Figure 7:
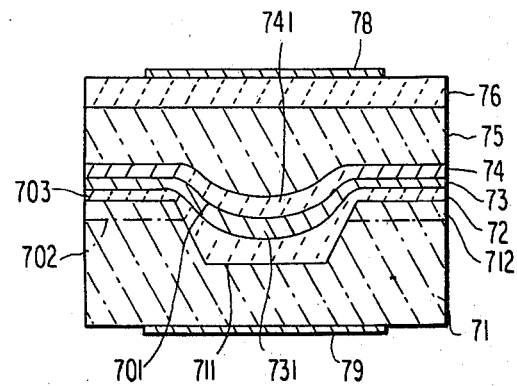
FIG. 7 is a transverse cross-sectional view of a semiconductor laser showing a third preferred embodiment of the present invention.

Referring now to FIG. 7, similarly to the embodiment shown in FIG. 5, a first cladding layer 72, a waveguide layer 73, an active layer 74, a second cladding layer 75 and a contact-facilitating layer 76 are made to grow successively on a substrate 71 having a groove 711 and a diffused layer 712, and electrodes 78 and 79 make direct contact with the contact-facilitating layer 76 and the substrate, respectively. Reference numerals 701, 702 and 703, respectively, designate rectifying junctions.

In this third preferred embodiment of the present invention, the upper surface of the waveguide layer 73 is made to have a depressed shape by stopping the growth before the upper surface becomes flat, but the thickness of the layer 73 at the central portion 731 is made thicker than the outside portions of the layer. Furthermore, the active layer 74 that has been grown on the waveguie layer 73 is also depressed at its central portion, and the thickness of the central portion 741 of this layer 74 is also thicker than the outside portions.

Describing in connection to only the difference between this third preferred embodiment and the embodiment shown in FIG. 5, the depth of the groove 711 is made somewhat deeper than the groove 511 in FIG. 5 and is equal to about 1.5 $\mu m$, and for that purpose the etching is effected for about 130 seconds at a room temperature under a stirring condition by employing the same etching solution as described above.

Typical thicknesses of the respective layers are, at the central portion, 0.8 μm for the n-type $Al_{0.38}Ga_{0.62}As$ layer 72, 0.5 μm for the n-type $Al_{0.1}Ga_{0.9}As$ layer 73, 0.2 μm for the p-type GaAs layer 74, 1.2 μm for the p-type $Al_{0.38}Ga_{0.62}As$ layer 75, and 1.2 μm for the p-type GaAs layer 76. The dopant concentrations of the respective layers are selected substantially equal to those in the preferred embodiment illustrated in FIG. 5. The operation of the embodiment is substantially equal to that of the preferred embodiment illustrated in FIG. 5, and hence description thereof will be omitted. In such modified construction, while the oscillation threshold current is raised as compared to the second preferred embodiment, there is an advantage that since the sum of the thicknesses of the active layer and the waveguide layer at the central portion becomes thicker, a high power output can be obtained.

Figure 8:
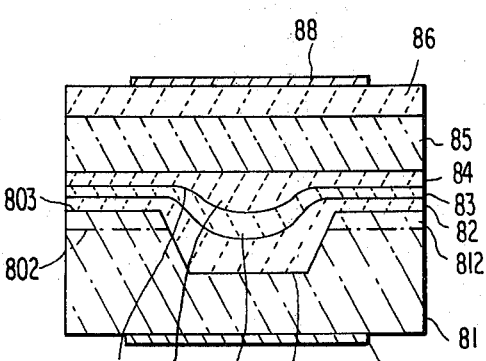
FIG. 8 is a transverse cross-sectional view of a semiconductor laser showing a fourth preferred embodiment of the present invention.

In FIG. 8, it is illustrated a further modification of the embodiment shown in FIG. 7. This fourth preferred embodiment of of the present invention is identical to the above-described third preferred embodiment except for the point that as will be seen from FIG. 8, the upper surface of the active layer 84, that is, the surface contacting with the second cladding layer 85 is flat, and the cross-section of the active layer 84 at the portion above the groove 811 in the substrate 81 is of plano-convex shape. In such further modified construction, while the oscillation thrushold current is raised as compared to the third preferred embodiment, there is an advantage that a higher power output can be obtained. In addition, in FIG. 8, reference numeral 82 designates a first cladding layer, numeral 86 designates a contact-facilitating layer, numerals 88 and 89 designate electrodes, numerals 801, 802 and 803 designate rectifying junctions, and reference numeral 831 designates a curved section in the central portion of the waveguide layer 83.

While four preferred embodiments of the present invention have been described above, the means for restricting the path of the injection current could be realized by other means. For instance, even if a layer formed by proton bombardment or an insulating layer is provided in place of the diffused layer, or even if the injection current path is restricted by diffusing a p-type impurity such as zinc in a stripe-shape from the side of the contact-facilitating layer to the extent of the active layer, the effect and advantage of the present invention would not be degraded. As a matter of course, the means for restricting the injection current path employed in the third and fourth preferred embodiments could be replaced by the equivalent means used in the first preferred embodiment. In addition, though the semiconductor structure in which the injection current path is restricted, is employed in the above-described embodiments for the purpose of enhancing the efficiency, even if the structure adapted to restrict the injection current path is not employed, the semiconductor laser structure is not contrary to the essence of the present invention.

While the semiconductor lasers in the above-described embodiments were $GaAs-Al_xGa_{(1-x)}As$ ($0 \leq x \leq 1$) series semiconductor lasers, it is a matter of course that the semiconductor laser according to the present invention could be formed by employing In P for the semiconductor substrate and a quaternary system crystal such as $In_xGa_{(1-x)}As_yP_{(1-y)}$ for the light emitting region.

In this modified case, since the In P substrate has a larger energy gap and a smaller refractive index than the crystal of the light emitting region, the In P substrate itself has the same function as the first cladding layer in the GaAs-AlGaAs series semiconductor laser. Therefore, in the semiconductor laser employing the In P substrate, a groove is formed in the In P substrate and a waveguide layer is grown directly on the In P substrate. In other words, with a layer structure formed by removing the first cladding layer from the above-described embodiments, the same functions and effects of the present invention as the above-described embodiments can be achieved.

Moreover, while a groove is provided in a semiconductor substrate, and by making use of the difference in the speed of crystal growth between the grooved portion and the portion outside of the groove, a depression is formed in a first cladding layer and a convex region is formed in a central portion of a waveguide layer grown on the first cladding layer in the above-described embodiments, the convex region can be formed in the waveguide region even with a semiconductor substrate structure not provided with a groove. More particularly, a first cladding layer is formed on a flat semiconductor substrate, subsequently a depression is formed by etching the central portion of the first cladding layer, and by forming a waveguide layer on the first cladding layer, a semiconductor laser having the same functions and effects as the above-described embodiments can be obtained.

In addition, the present invention is not limited to the liquid-phase epitaxial growth process only, but it could be practiced with exactly the same effects by employing a chemical-vapor deposition growth process or a molecular beam epitaxial growth process.

Furthermore, it is possible to make the thickness of the waveguide layer larger than that of the first cladding layer at the central portion of the groove.

What is claimed is:

1. In a semiconductor laser comprising an active layer in which light is produced by recombination of injected carriers, a waveguide layer in contact with one surface of said active layer and having a confining effect for said carriers, the thickness of said waveguide layer in a plane perpendicular to the output direction of said light being larger at the inside portion than at the outside portion of said waveguide layer, a first cladding layer contacting with the surface of said waveguide layer not in contact with said active layer for confining said light within said waveguide layer, and a second cladding layer contacting with the other surface of said active layer for confining both said carriers and said light within said active layer.

2. A semiconductor laser as claimed in claim 1, wherein the surface of said second cladding layer not in contact with said active layer is in contact with a contact facilitating layer having an electrode thereon.

3. A semiconductor laser as claimed in claim 1, wherein the effective refractive index of said waveguide layer is higher at the central portion thereof than at the outside portion thereof, thereby condensing the light traveling therethrough within the central portion.

4. A semiconductor laser as claimed in claim 1, wherein said waveguide is of plano-convex shape, the planar side thereof being in contact with said active layer.

5. A semiconductor laser as claimed in claim 1, wherein said waveguide layer has a concave-convex shape, the concave side thereof being in contact with said active layer, said active layer being provided with a convex surface complementary to said concave surface, and having a thickness at the central portion thereof which is greater than the thickness at the outside portions thereof.

6. A semiconductor laser as claimed in claim 5, wherein said active layer is provided with a concave surface on the side opposite said waveguide layer, and said second cladding layer is provided with a complementary convex surface in contact with said active layer concave surface.

7. A semiconductor laser as claimed in claim 5, wherein said active layer is of plano-convex shape, the planar side thereof being in contact with said second cladding layer.

8. In a semiconductor laser comprising a first semiconductor layer having a surface with an elongated groove formed thereon, a second semiconductor layer formed on said first semiconductor layer and having a larger refractive index than said first semiconductor layer, the thickness of the portion of said second semiconductor layer opposed to said groove being larger than the thickness of the portion of said second semiconductor layer opposed to the outside of said groove, a third semiconductor layer formed on said second semiconductor layer and having a larger refractive index than said second semiconductor layer, and a fourth semiconductor layer formed on said third semiconductor layer and having a smaller refractive index than said third semiconductor layer, said third semiconductor layer having a different conductivity type from either said second semiconductor layer or said fourth semiconductor layer so that a first rectifying junction is formed at the interface either between said third semiconductor layer and said second semiconductor layer or between said third semiconductor layer and said fourth semiconductor layer.

9. A semiconductor laser as claimed in claim 8, further comprising means for restricting an injection current to a path passing through the portion of said third semiconductor layer opposed to said groove when said first rectifying junction is forward biased, wherein light is generated by radiative recombination of carriers within the portion of said third semiconductor layer opposed to said groove, and population inversion is achieved in the portion of said third semiconductor layer opposed to said groove, and whereby the light is guided by said first semiconductor layer and said fourth semiconductor layer due to the fact that the refractive indexes of said first semiconductor layer and said fourth semiconductor layer are lower than those of said second semiconductor layer and said third semiconductor layer.

10. A semiconductor laser as claimed in claim 9, wherein said restricting means comprises an apertured film.

11. A semiconductor laser as claimed in claim 9, wherein said restricting means comprises a diffused layer situated between said first semiconductor layer and said first cladding layer and outwardly of the grooved region of said first semiconductor layer.

12. A semiconductor laser as claimed in claim 11, wherein said diffused layer is formed of a conductivity type different from that of said first semiconductor layer and said first cladding layer, thereby creating a second rectifying junction which is back biased when said first rectifying junction is forward biased.

13. A semiconductor laser as claimed in claim 12, wherein said diffused layer comprises zinc.

* * * * *